(12) United States Patent
Murooka et al.

(10) Patent No.: US 8,766,225 B2
(45) Date of Patent: Jul. 1, 2014

(54) STORAGE DEVICE

(75) Inventors: Kenichi Murooka, Yokohama (JP);
Hiroshi Kanno, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 91 days.

(21) Appl. No.: 13/040,764

(22) Filed: Mar. 4, 2011

(65) Prior Publication Data

US 2011/0210304 A1    Sep. 1, 2011

Related U.S. Application Data

(63) Continuation of application No. PCT/JP2008/066115, filed on Sep. 5, 2008.

(51) Int. Cl.
*H01L 29/02*    (2006.01)

(52) U.S. Cl.
USPC ............... 257/2; 257/212; 257/656; 257/657; 257/910

(58) Field of Classification Search
USPC ...................... 257/2, 212, 655–657, E21.336, 257/E21.361, 910
See application file for complete search history.

(56) References Cited

U.S. PATENT DOCUMENTS

| | | | | |
|---|---|---|---|---|
| 4,064,620 A | * | 12/1977 | Lee et al. | 438/122 |
| 4,951,109 A | * | 8/1990 | Bechteler et al. | 257/131 |
| 5,258,624 A | * | 11/1993 | Battersby et al. | 257/11 |
| 5,747,872 A | * | 5/1998 | Lutz et al. | 257/611 |
| 5,811,873 A | | 9/1998 | Soejima | |
| 5,977,611 A | * | 11/1999 | Sittig et al. | 257/603 |
| 7,176,064 B2 | * | 2/2007 | Herner | 438/131 |
| 7,265,049 B2 | * | 9/2007 | Herner et al. | 438/653 |
| 7,405,465 B2 | * | 7/2008 | Herner | 257/616 |
| 7,825,455 B2 | * | 11/2010 | Lee et al. | 257/315 |
| 8,227,784 B2 | * | 7/2012 | Nakajima | 257/2 |
| 2003/0205775 A1 | * | 11/2003 | Einthoven et al. | 257/497 |

(Continued)

FOREIGN PATENT DOCUMENTS

| | | |
|---|---|---|
| JP | 62-115880 | 5/1987 |
| JP | 63-81868 | 4/1988 |

(Continued)

OTHER PUBLICATIONS

U.S. Appl. No. 13/001,147, filed Dec. 23, 2010, Murooka.

(Continued)

*Primary Examiner* — Fernando L Toledo
*Assistant Examiner* — Mohammed Shamsuzzaman
(74) *Attorney, Agent, or Firm* — Oblon, Spivak, McClelland, Maier & Neustadt, L.L.P.

(57) ABSTRACT

According to the embodiment, a storage device includes row lines arranged parallel to one another, column lines arranged parallel to one another to intersect with the row lines, and a memory cell disposed at each of intersections of the row lines and the column lines and including a resistance-change element and a diode connected in series to the resistance-change element. The diode includes a stack of a first semiconductor region containing an impurity of a first conductivity type, a second semiconductor region containing an impurity of the first conductivity type lower in concentration than in the first semiconductor region, and a third semiconductor region containing an impurity of a second conductivity type. An impurity concentration in the second semiconductor region of the diode in a first adjacent portion adjacent to the first semiconductor region is higher than that in a second adjacent portion adjacent to the third semiconductor region.

9 Claims, 8 Drawing Sheets

(56) References Cited

U.S. PATENT DOCUMENTS

| | | | |
|---|---|---|---|
| 2005/0121743 A1* | 6/2005 | Herner | 257/530 |
| 2005/0226067 A1* | 10/2005 | Herner et al. | 365/201 |
| 2006/0006495 A1* | 1/2006 | Herner et al. | 257/530 |
| 2006/0189107 A1* | 8/2006 | Chiola et al. | 438/570 |
| 2006/0250837 A1* | 11/2006 | Herner et al. | 365/148 |
| 2007/0047323 A1* | 3/2007 | Murooka et al. | 365/185.23 |
| 2007/0108558 A1* | 5/2007 | Nemoto | 257/655 |
| 2007/0165442 A1 | 7/2007 | Hosi et al. | |
| 2007/0228414 A1* | 10/2007 | Kumar et al. | 257/183 |
| 2007/0240995 A1 | 10/2007 | Odagawa et al. | |
| 2008/0239790 A1* | 10/2008 | Herner et al. | 365/151 |
| 2009/0268508 A1* | 10/2009 | Chen et al. | 365/148 |
| 2010/0163821 A1* | 7/2010 | Ohashi | 257/2 |
| 2010/0237346 A1* | 9/2010 | Kanno et al. | 257/49 |
| 2010/0238704 A1* | 9/2010 | Komura et al. | 365/148 |
| 2011/0068315 A1* | 3/2011 | Nakajima | 257/4 |
| 2011/0089391 A1* | 4/2011 | Mihnea et al. | 257/2 |
| 2011/0127484 A1* | 6/2011 | Yasutake | 257/2 |
| 2011/0140064 A1* | 6/2011 | Bandyopadhyay et al. | 257/2 |
| 2011/0228589 A1* | 9/2011 | Murooka | 365/148 |
| 2012/0061639 A1* | 3/2012 | Yasuda | 257/2 |
| 2012/0069632 A1* | 3/2012 | Hayakawa et al. | 365/148 |
| 2012/0145984 A1* | 6/2012 | Rabkin et al. | 257/2 |

FOREIGN PATENT DOCUMENTS

| | | |
|---|---|---|
| JP | 8-316500 | 11/1996 |
| JP | 2007-188603 | 7/2007 |
| JP | 2007-287761 | 11/2007 |

OTHER PUBLICATIONS

Japanese International Search Report issued Dec. 9, 2008 in PCT/JP2008/066115 filed Spetember 5, 2008.

Japanese Written Opinion issued Nov. 20, 2008 in PCT/JP2008/066115 filed Sep. 5, 2008.

Shinichiro Kimura, "Semiconductor Memory: DRAM", ULSI Research Department, Central Research Laboratory, vol. 69, No. 10, (2000), pp. 1233-1240.

Natsuo Ajika, "Flash Memory, Recent Topics", Mitsubishi Electric Corporation, Semiconductor Group, Memory IC Division, Memory Process Design Department, Flash Memory Process Design Group, vol. 69, No. 12, (2000), pp. 1462-1466.

* cited by examiner

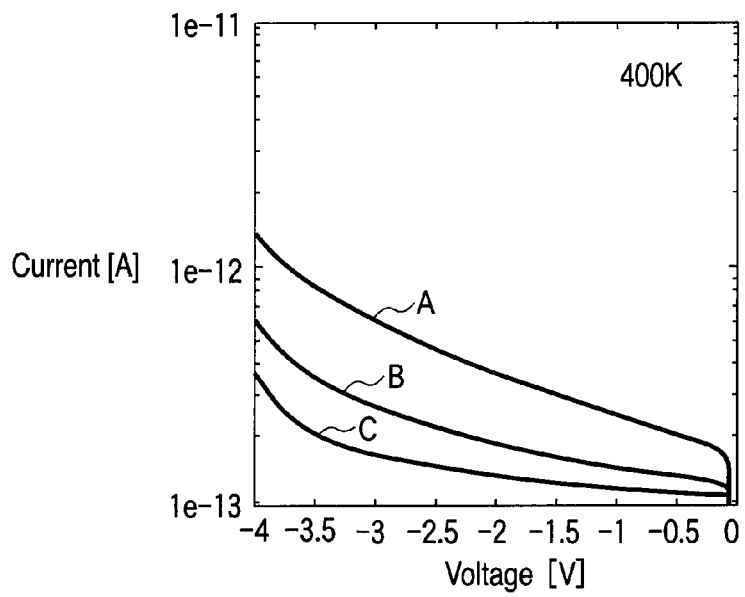
F I G. 3
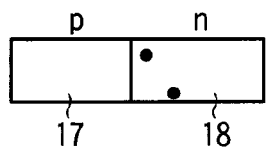
F I G. 4A
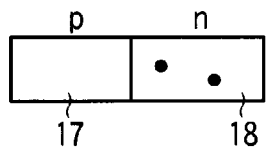
F I G. 4B
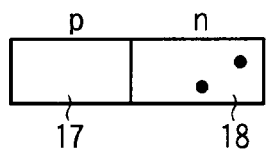
F I G. 4C

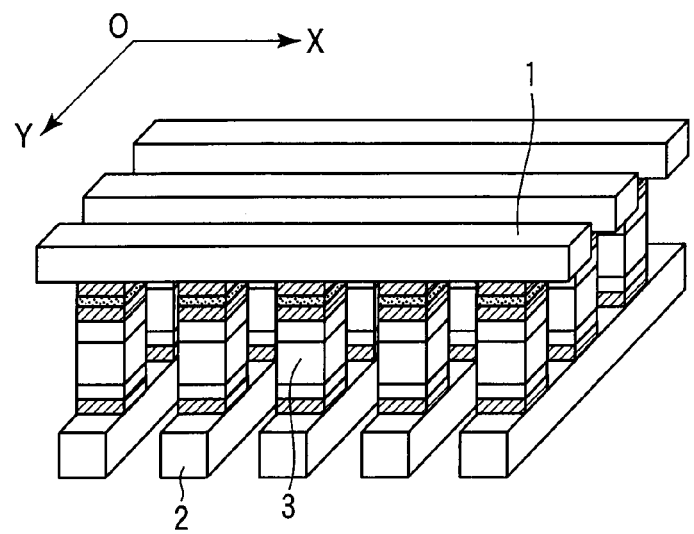
F I G. 5
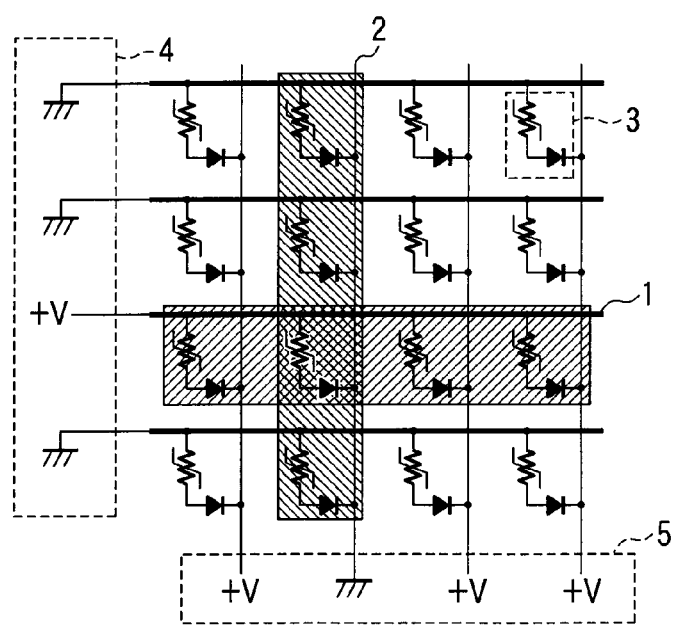
F I G. 6

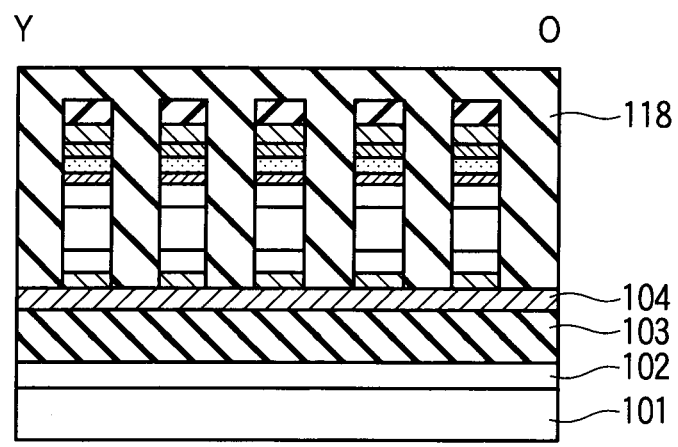
F I G. 9K

STORAGE DEVICE

CROSS-REFERENCE TO RELATED APPLICATIONS

This is a Continuation Application of PCT Application No. PCT/JP2008/066115, filed Sep. 5, 2008, which was published under PCT Article 21(2) in Japanese.

FIELD

Embodiments described herein relates generally to a storage device that uses a diode and a resistance-change element.

BACKGROUND

Recently, along with the increasing degree of integration in a semiconductor device, a circuit pattern for an LSI element that constitutes the semiconductor device has been more miniaturized. For the miniaturization of the pattern, not only a smaller line width but also improvements in the dimensional accuracy and positional accuracy of the pattern are required. A storage device called a memory is not an exception. It has been continuously required that a given charge necessary for storing be retained in a smaller region in a cell formed by use of a highly accurate processing technique.

Various memories such as a DRAM, an SRAM, and a flash memory have heretofore been manufactured. All of these memories use MOSFETs for memory cells. Therefore, in response to pattern miniaturization, the dimensional accuracy is required to be improved at a rate higher than the rate of the miniaturization. Accordingly, a lithography technique for forming such a pattern is also under a heavy load. This is a reason for a rise in the cost for a lithography process that accounts for a large proportion of current mass-production costs, that is, a rise in manufacturing costs.

In the meantime, a recently suggested technique that solves the above-mentioned problem is a memory called a ReRAM in which a memory cell comprises a non-ohmic element typified by a diode and a resistance-change material. The ReRAM can be configured without using the accumulation of a charge for storing and without using a MOSFET for the memory cell. Thus, the ReRAM is expected to provide a higher degree of integration than existing trends.

However, the diode used in the memory cell of the ReRAM has to satisfy certain standards regarding the allowable magnitude of a current that can flow in a forward direction depending on the characteristics of the resistance-change material and regarding the allowable magnitude of a leakage current that flows in a reverse direction. In order to satisfy such standards, many technical problems have to be solved particularly when a cell having a small sectional area is used as a result of a higher degree of integration.

Along with the pattern miniaturization, the conventionally used memory that uses a MOSFET for a cell has become less acceptable in respect of the dimensional accuracy and positioning accuracy of the pattern, and entails factors for a rise in manufacturing costs in addition to technical difficulties. On the other hand, in the ReRAM which does not use a MOSFET for a cell and which uses a non-ohmic element typified by a diode and a resistance-change material, it is preferable to use a diode having a low reverse leakage current in order to prevent erroneous writing into an unselected cell and hold down the total power consumption in writing. In general, the reverse leakage current can be suppressed by increasing the thickness of a low-impurity-concentration layer (i-layer) of the diode. However, in order to maintain the easiness of processing, the thickness of the low-impurity-concentration layer (i-layer) of the diode needs to remain less than or equal to a given thickness. Fulfilling these requirements is a challenge.

BRIEF DESCRIPTION OF THE DRAWINGS

FIG. 3 is a characteristic diagram showing the voltage-current characteristic of the diode in FIG. 1;
FIG. 4A is a schematic diagram showing an example of the distribution of impurity atoms in a (n-type) region 18 of the diode in FIG. 1;
FIG. 4B is a schematic diagram showing another example of the distribution of impurity atoms in the (n-type) region 18 of the diode in FIG. 1;
FIG. 4C is a schematic diagram showing still another example of the distribution of impurity atoms in the (n-type) region 18 of the diode in FIG. 1;
FIG. 5 is a perspective view of the storage device according to the embodiment;
FIG. 6 is a circuit diagram of the storage device according to the embodiment;
FIG. 9K is a sectional view of the storage device in a step following FIG. 9J.

DETAILED DESCRIPTION

In general, according to one embodiment, a storage device includes a plurality of row lines arranged parallel to one another, a plurality of column lines arranged parallel to one another to intersect with the row lines, and a memory cell which is disposed at each of intersections of the row lines and the column lines and which comprises a resistance-change element and a diode connected in series to the resistance-change element. The diode includes a stack of a first semiconductor region containing an impurity of a first conductivity type, a second semiconductor region containing an impurity of the first conductivity type lower in concentration than in the first semiconductor region, and a third semiconductor region containing an impurity of a second conductivity type. An impurity concentration in the second semiconductor region of the diode in a first adjacent portion adjacent to the first semiconductor region is higher than that in a second adjacent portion adjacent to the third semiconductor region.

Embodiments will be described hereinafter with reference to the drawings. It is to be noted that the drawings are schematic and that the relation between the thickness and planar dimensions, the ratio of the thickness of layers, etc. are different from real ones. Therefore, the following description should be considered to judge specific thickness and dimensions. It is also to be noted that the drawings include parts in which the relation and ratio of dimensions are different.

First Embodiment

Figure 1:
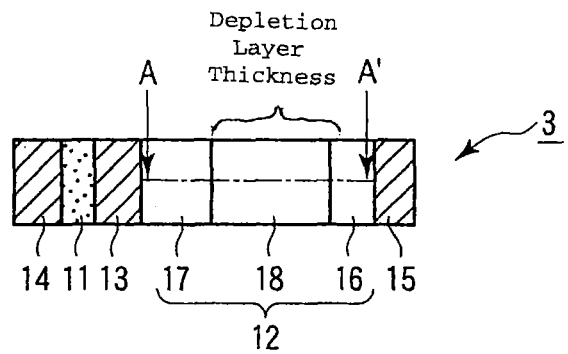
FIG. 1 is a sectional view of a memory cell that constitutes a storage device according to one embodiment.

In FIG. 1, a memory cell 3 includes a resistance-change element 11, a diode 12, and metal electrodes 13, 14, and 15. These components are connected in series to one another.

The resistance-change element 11 is made of a film of $ZnMn_2O_4$ having a thickness of 10 nm. One end of the resistance-change element 11 is connected to a stack wiring line of W and TiN via an electrode of TiN. The other end is connected to a p-side of a pn junction diode made of Si via an electrode of TiN. An n-side of the pn junction diode is connected to a wiring line made of W and TiN via an electrode of TiN.

Here, the resistance-change element is an element which changes between at least two resistance magnitudes of a low-resistance state and a high-resistance state, and can be produced from a thin film made of at least one material selected from the group consisting of $ZnMn_2O_4$, NiO, $TiO_2$, $SrZrO_3$, and $Pr_{0.7}Ca_{0.3}MnO_3$. It is known that the resistance-change element in the high-resistance state changes into the low-resistance state when a voltage greater than or equal to a certain voltage is applied and that the resistance-change element in the low-resistance state changes into the high-resistance state when a current greater than or equal to a certain current flows.

On the other hand, the metal electrodes 13, 14, and 15 are made of TiN, and function as not only in a conductive material but also so-called barrier metals to inhibit interdiffusion of constituent atoms between the resistance-change element, diode, and wiring line.

Figure 2A:
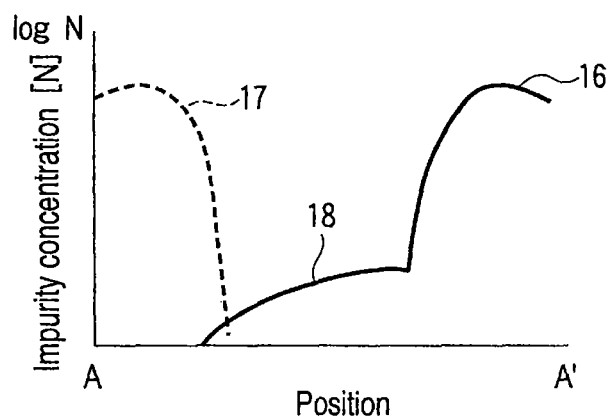
FIG. 2A is an impurity concentration distribution diagram of a diode portion in the memory cell in FIG. 1.

The present embodiment is primarily characterized by the configuration of the diode 12. Here, the film configuration of the diode can be described as, for example, $p^+/n^-/n^+$ if the conductivity type of the semiconductor is represented by p or n and the degree of the impurity concentration in the semiconductor is represented by + or − in accordance with a generally used notation. According to the present embodiment, an $n^-$ semiconductor region 18 between an $n^+$ semiconductor region 16 and a $p^+$ semiconductor region 17 shown in FIG. 1 has an impurity concentration distribution, and has a higher impurity concentration on the side (adjacent portion) close to the $n^+$ semiconductor region 16 than on the side (adjacent portion) close to the $p^+$ semiconductor region 17. The impurity concentration distribution through the A-A' section in FIG. 1 is as shown in FIG. 2A when in the form of a graph.

The reason for producing such a configuration is described below. A ReRAM that uses the above-mentioned resistance-change element needs a cell voltage of about 2.5 to 4 V in a set operation for changing from the low-resistance state to the high-resistance state. In this case, the diodes are biased in the reverse direction in a large majority of other cells that constitute a cross-point matrix. Thus, the problem when the reverse current in the diode is high is that there is a strong possibility of erroneous setting wherein an undesired cell is erroneously set.

Furthermore, even if the possibility of the erroneous setting can be sufficiently suppressed, the total of the reverse current is about M×N when the size of the matrix is about M×N. Therefore, a lowest possible reverse leakage current is preferable for lower power consumption.

On the other hand, increasing the thickness of the $n^-$ semiconductor region 18 in FIG. 1 is effective in reducing the reverse leakage current in the diode. However, increasing the thickness of the $n^-$ semiconductor region 18 means a higher processing aspect ratio. Thus, in accordance with cell miniaturization, there remains a problem of a further rise in difficulty.

Accordingly, the present inventors have investigated means for inhibiting a reverse leakage current while maintaining a given thickness of the diode. Specifically, attention is focused on the distribution of impurity atoms in the $n^-$ semiconductor region 18. It is assumed that the $n^-$ semiconductor region does not have a uniform impurity concentration. The electrical characteristics of the diode are examined using a newly developed device simulator.

Here, the characteristics of the newly developed device simulator are briefly described. This device simulator is primarily characterized by being capable of a calculation that explicitly takes into account the positions of the individual impurity atoms to adapt to element miniaturization. It has been difficult for a conventional device simulator to handle such a calculation. For example, when the semiconductor region has a size of 22 nm×22 nm×40 nm and an impurity concentration of $1\times10^{17}$ $cm^{-3}$, the number of contained impurity atoms is about two. When device characteristics are determined by a small number of impurity atoms, setting a continuous uniform impurity concentration in the whole semiconductor region as in the case of the conventional device simulator cannot be said to be appropriate, and considering discrete distributions of the individual impurity atoms is important.

Specifically, according to the method of the conventional device simulator, an impurity concentration is set in a given region, and a uniform potential field calculated from this concentration is used. In contrast, the newly developed device simulator is capable of setting each of the positions of the impurity atoms and performing a calculation in consideration of a potential field created by each impurity atom. The use of this function has enabled, for the first time, a simulation that takes into account the discrete distributions of the impurity positions in a semiconductor device having a microstructure.

Calculations of the reverse leakage current of the diode by this device simulator are shown in FIG. 3. Curves A, B, and C in FIG. 3 show reverse current-voltage characteristics corresponding to the n-type region impurity atom distributions of three kinds of diodes shown in FIGS. 4A to 4C. In the graph, the n-type region corresponds to the $n^-$ semiconductor region 18 in FIG. 1. The left of the n-type region is connected to the $p^+$ semiconductor region 17, and the right of the n-type region is connected to the $n^+$ semiconductor region 16 (not shown).

As apparent from FIG. 3, if the thickness and impurity concentration of the $n^-$ semiconductor region are constant, the reverse leakage current can be more inhibited when the impurity atoms in the $n^-$ semiconductor region are distributed in the vicinity of the $n^+$ semiconductor region than when the impurity atoms are distributed in the vicinity of the $p^+$ semiconductor region.

That is, when the n⁻ semiconductor region is seen in broad perspective, a storage device having a significantly low erroneous writing probability and low power consumption can be provided by a configuration that uses a diode having a higher impurity concentration on the side close to the n⁺ semiconductor region 16 than on the side close to the p⁺ semiconductor region 17.

Figure 2B:
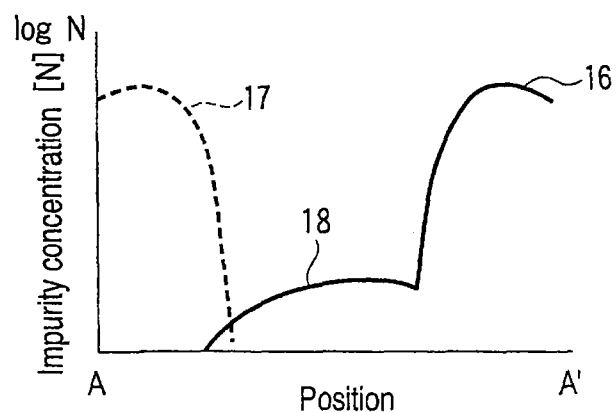
FIG. 2B is another impurity concentration distribution diagram of the diode portion in FIG. 1.

Furthermore, as a result of simulating the reverse current-voltage characteristics of the diode adapted to a great number of n-type semiconductor region impurity atom distributions, the following has been proved: The influence of the impurity atom distribution in the center of the n⁻ semiconductor region is not important in inhibiting the reverse leakage current. For example, even if the impurity concentration distribution is shaped to have a convexity in the center as shown in FIG. 2B, the concentration has only to be higher on the side close to the n⁺ semiconductor region than on the side close to the semiconductor region.

The conductivity type of the center of the diode is an n-type in the present embodiment, but may be a p-type instead. The conductivity type of both ends of the diode can interchange an n-type and a p-type. That is, the configuration may be p⁺/p⁻/n⁺, n⁺/n⁻/p⁺, or n⁺/p⁻/p⁺, instead of p⁺/n⁻/n⁺.

Furthermore, the impurity atom distribution in the semiconductor region does not have to be defined on the basis of the positions of the crystal lattices of the atoms that constitute a semiconductor, and the average number of impurity atoms in a region having a size of about 2 to 3 nm is significant. This is based on the following physical speculation. As described above, carriers flowing in the diode follow an electric potential field formed in the semiconductor region. The effective expansion of the potential field produced by the impurity atoms can be defined by so-called Bohr radius in first approximation.

This Bohr radius is provided by $(\in_r/(m_e/m))a_0$ using a relative dielectric constant $\in_r$ and an effective mass ratio $m_e/m$ on the basis of a Bohr radius of a hydrogen atom $a_0=0.0528$ nm. It is known that when silicon is used as a semiconductor, the relative dielectric constant $\in_r$ is 11.7 and the effective mass ratio $m_e/m$ is about 0.2 to 0.3, and the Bohr radius is therefore 2 to 3 nm.

Thus, as described above, if the average number of impurity atoms is determined in a range of 2 to 3 nm as described above, a current flowing through the diode is determined. The above-mentioned part close to the p⁺ semiconductor region or part close to the n⁺ semiconductor region can be regarded as a region 2 to 3 nm from an interface with the p⁺ semiconductor region or a region 2 to 3 nm from an interface with the n⁺ semiconductor region. This region is referred to as an adjacent portion in the present embodiment.

In addition, the thickness of the low-impurity-concentration semiconductor region of the diode according to the present embodiment is only about 100 nm or less at most. When the thickness of the low impurity-concentration semiconductor region is smaller than the distance of a depletion layer (approximate expression: $(2\in Vd/eN)^{1/2}$, $\in$: the dielectric constant of the semiconductor, Vd: the built-in potential of the semiconductor, e: an elementary electric charge, and N: impurity concentration) (see the "Depletion Layer Thickness" labeled in FIG. 1) in the semiconductor, the depletion layer has prevailed all over the low-impurity-concentration semiconductor region, and a desired forward current is secured by taking advantage of the small thickness of the low-impurity-concentration semiconductor region.

Moreover, the characteristics of the diode obtained according to the present embodiment are particularly significantly advantageous when the diodes are used in combination with the resistance-change elements as a large-scale memory cell array so that a sufficiently low reverse leakage current of about 1 pA or less in the case of the diode alone is multiplied by the number of parallel elements which is one million or more.

FIG. 5 is a perspective view of the memory cell array in the storage device according to the embodiment. A so-called cross-point configuration is provided wherein row lines 1 arranged parallel and column lines 2 also arranged parallel face one another so that the directions of these lines intersect with each other, and the memory cell 3 comprising the resistance-change element and the diode is disposed at each intersection. Here, in accordance with a conventional MOS memory cell, the row lines are referred to as word lines, and the column lines are referred to as bit lines. The pitches of the word lines and the bit lines are 44 nm. That is, lines having a width of 22 nm and spaces having a width of 22 nm are provided, and the section of a cell portion is 22 nm×22 nm.

In such a structure, the word lines and the bit lines simply form a line-and-space pattern, and have only to be positioned to intersect with one another. There is no need to consider deviations in the direction of the word lines and in the direction of the bit lines. Thus, the accuracy of positioning in the cell during manufacture can be significantly eased, and the manufacture is facilitated.

FIG. 6 is a circuit diagram of an extracted part of the cross-point memory cell that uses the resistance-change elements and the diodes constituting the storage device according to the embodiment. The memory cell 3 comprising the resistance-change element and the diode is connected to each intersection of the word line 1 and the bit line 2. The word lines 1 are connected to a row decoder 4, and the bit lines 2 are connected to a column decoder 5.

As described above, the resistance-change element is an element characteristic of which changes between at least two resistance magnitudes of the low-resistance state and the high-resistance state. It is known that the resistance-change element in the high-resistance state changes into the low-resistance state when a voltage greater than or equal to a certain voltage is applied and that the resistance-change element in the low-resistance state changes into the high-resistance state when a current greater than or equal to a certain current flows.

In FIG. 6, the row decoder 4 selects the third row from the top, and the column decoder 5 selects the second column from the left. In the cross-point memory, the selected word line is set at +V which is a [high] potential, the selected bit line is set at 0 V (ground potential) which is a [low] potential, the unselected word lines are set at 0 V (ground potential) which is a [low] potential, and the unselected bit lines are set at +V which is a [high] potential, so that the diodes of the selected cells are in a forward direction, in the case of FIG. 6.

Since the voltage is a relative value, the parts shown as the ground potentials do not necessarily have to be 0 V. The difference between the [high] potential and the [low] potential has only to be a predetermined voltage. The value of V is positive. When the resistance-change element is used, the relation $V_{read}<V_{reset}<V_{set}$ is satisfied among the voltage $V_{set}$ used for writing, the voltage $V_{reset}$ used for erasing, and the voltage $V_{read}$ used for reading, in accordance with the above-mentioned characteristics.

If a voltage is applied to such a pattern, there is no voltage applied to and no current flowing through the resistance-change element because the potentials of both ends of the cell are equal in a half-selected cell in which one of the word line and the bit line is selected. In the unselected cell in which neither the word line nor the bit line is selected, a reverse voltage is applied to the diode, so that the diode takes charge of most of the voltage applied to the cell. Thus, a low voltage is applied to the resistance-change element, and a significantly low current flows through the resistance-change element.

On the other hand, the diode is in the forward direction in the selected cell. Thus, a voltage obtained by subtracting the on-voltage of the diode from the applied voltage is applied to the resistance-change element, and a sufficient current can also flow therethrough. As a result of such a principle, inter-cell interference can be prevented, and a reading/writing (erasing) can be performed only in the selected cells.

Figure 7:
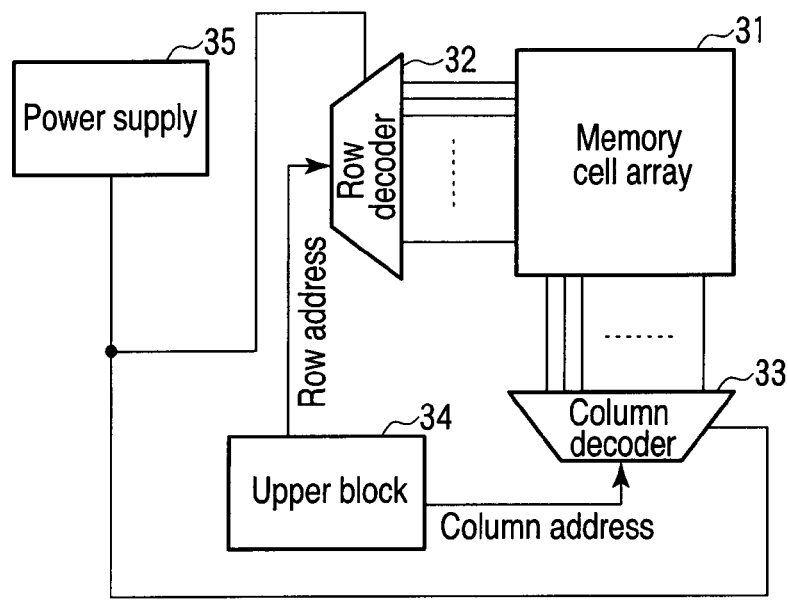
FIG. 7 is a block diagram of the storage device according to the embodiment.

FIG. 7 is a block diagram of the storage device according to the first embodiment. A row decoder 32 is connected to word lines (row wiring lines) of a memory cell array 31, and a column decoder 33 is connected to bit lines (column wiring lines). On the basis of address information from an upper block 34, the row decoder 32 and the column decoder 33 select a word line and a bit line that are connected to cells in the memory cell array for which reading/writing is to be performed. A power supply 35 generates a predetermined combination of voltages corresponding to the reading, writing and erasing operations, and supplies the voltages to the row decoder 32 and the column decoder 33.

Figure 8:
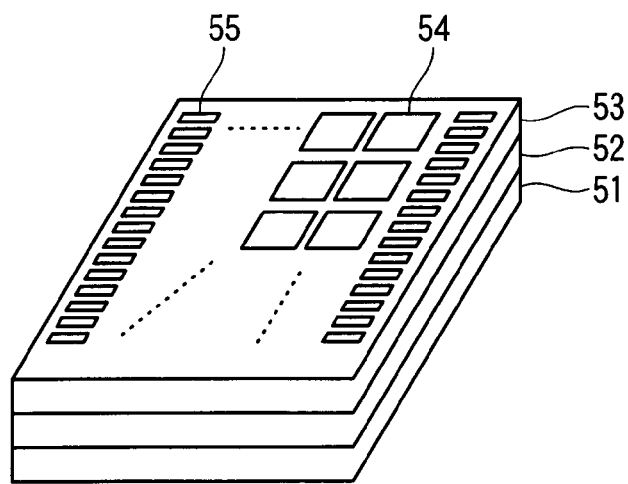
FIG. 8 is a perspective view of a chip in which the storage device according to the embodiment is in an IC form.

FIG. 8 is a perspective view showing the overall configuration of the storage device according to the first embodiment. A CMOS circuit 52 including wiring lines is formed on a conventional Si substrate 51 by a conventionally used process, and a layer 53 including memory cell portions 54 is formed on the CMOS circuit 52. The individual memory cell portions 54 in FIG. 8 correspond to the memory cell arrays 31 in FIG. 7. Moreover, a part which includes the decoders and the upper block in FIG. 7 and which is called a peripheral circuit in a conventional memory is included in the CMOS circuit 52 in FIG. 8.

The CMOS circuit 52 may be designed and manufactured by, for example, 90-nm design rules, which are less strict than those for the wiring lines of the memory cell portions 54, except for the portions connected to the memory cell portions 54. One memory cell portion 54 occupies a region of about 22 μm square, and includes 512×512 intersections. An electrical connection to the CMOS circuit 52 is provided around each of the memory cell portions 54. Blocks based on the memory cell portions 54 and the surrounding connections thereof are arranged in matrix form. Through-holes are formed in the layer 53 including the memory cell portions 54, and input/output portions 55 of the device which comprise terminals electrically connected to an input/output portion of the CMOS circuit 52 are formed at the end of the layer 53 including the memory cell portions 54, as shown in FIG. 8.

The memory cell portions 54 and the CMOS circuit 52 are connected in a vertical direction in such a configuration, thereby enabling a reduction in operation time and a significant increase in the number of cells available for reading/writing at the same time without any increase in chip area. In addition, the device input/output portions 55 are bonded to a lead frame in a packaging process, as in a conventional semiconductor device.

Although $ZnMn_2O_4$ is used as the resistance-change material for the memory operation in the embodiment, other materials can be used instead, such as NiO, $TiO_2$, $SrZrO_3$, or $Pr_{0.7}Ca_{0.3}MnO_3$. Although TiN is used as the electrode in contact with the resistance-change material, other materials can be used instead, such as Pt, W, WN, TaN, or Nb-doped $TiO_2$. Although the PN junction diode made of Si is used as the diode, a PN junction diode made of an SiGe alloy can be used instead.

As described above, according to the first embodiment, it is possible to obtain a diode having a low reverse leakage current to constitute the memory cell of the ReRAM without increasing the length of the low-impurity-concentration region of the diode in a current direction. Consequently, a high-integration storage device that is easily manufactured and highly reliable can be provided at low cost.

Second Embodiment

In a second embodiment, a method of manufacturing the storage device according to the first embodiment is described with reference to FIGS. 9A to 9K. FIGS. 9A to 9I are sectional views along the O-X direction of FIG. 5, and FIGS. 9J and 9K are sectional views along the O-Y direction of FIG. 5.

First, a substrate in which a desired CMOS circuit layer 102 is formed on one surface of a Si substrate 101 having a thickness of 720 μm by a conventional CMOS process is prepared. The CMOS circuit layer 102 includes a connection to the memory cell array as well as a normal MOSFET and multilayer wiring lines.

Figure 9A:
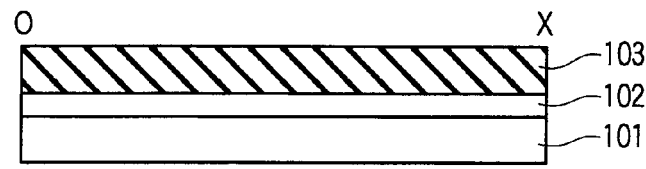
FIG. 9A is a sectional view for explaining a process of manufacturing the storage device according to the embodiment.
Figure 9B:
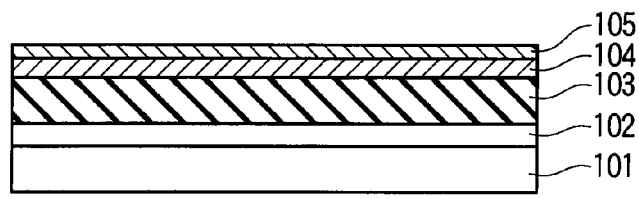
FIG. 9B is a sectional view of the storage device in a step following FIG. 9A.

Furthermore, as shown in FIG. 9A, an insulating film 103 made of $SiO_2$ and having a thickness of 300 nm is formed on the above-mentioned substrate by a CVD method that uses TEOS as the main material. As shown in FIG. 9B, a composite film 104 of TiN having a thickness of 10 nm and W having a thickness of 50 nm is then formed continuously by a sputtering method. A TiN film 105 having a thickness of 10 nm is then formed by the sputtering method. This TiN film 105 functions as a barrier metal that inhibits the diffusion of unnecessary impurities into the semiconductor films constituting the diode.

Figure 9C:
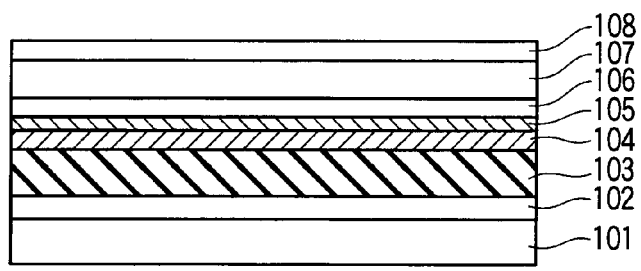
FIG. 9C is a sectional view of the storage device in a step following FIG. 9B.

As shown in FIG. 9C, an amorphous Si film is then formed by an LPCVD method that uses $SiH_4$ as the main material, and a desired semiconductor region is formed by an ion implantation method. The amorphous Si film having a thickness of 10 nm is first formed, and then an $n^+$ semiconductor region 106 containing about $10^{20}$ $cm^{-3}$ of arsenic is formed by arsenic ion implantation using an acceleration voltage of 1 kV. The amorphous Si film having a thickness of 90 nm is further formed, and then an $n^-$ semiconductor region 107 is formed by arsenic ion implantation using an acceleration voltage of 75 kV. The $n^-$ semiconductor region 107 has a thickness of 90 nm, contains an average of about $10^{17}$ $cm^{-3}$ of arsenic, and has a higher arsenic concentration in the lower part of the film. Boron ion implantation is then carried out at an acceleration voltage of 1 kV, so that the upper part of the previously formed $n^-$ semiconductor region 107 is formed into a $p^+$ semiconductor region 108 containing about $10^{20}$ $cm^{-3}$ of boron and having a thickness of 10 nm.

Regarding the thicknesses of the $n^+$ semiconductor region 106, the $n^-$ semiconductor region 107, and the semiconductor region 108 shown here, the thicknesses of the $n^+$ semiconductor region 106 and the $p^+$ semiconductor region 108 increase by about 20 nm, and the thickness of the $n^-$ semiconductor region 107 decreases by about 40 nm at the final phase after the end of the whole manufacturing process. This is attributed to impurity diffusion in a subsequent thermal process, particularly, in a high-temperature treatment intended for amorphous Si crystallization and impurity activation. The previously mentioned thicknesses are set in advance in consideration of such effects.

Figure 9D:
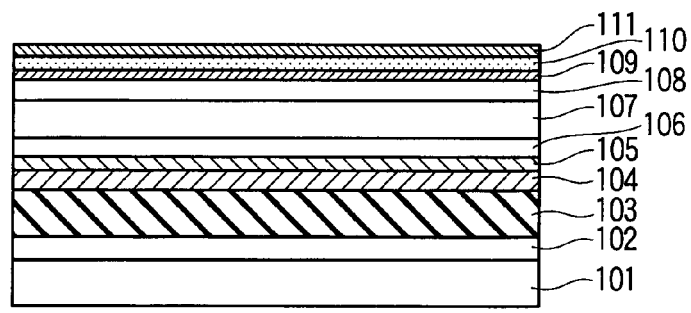
FIG. 9D is a sectional view of the storage device in a step following FIG. 9C.
Figure 9E:
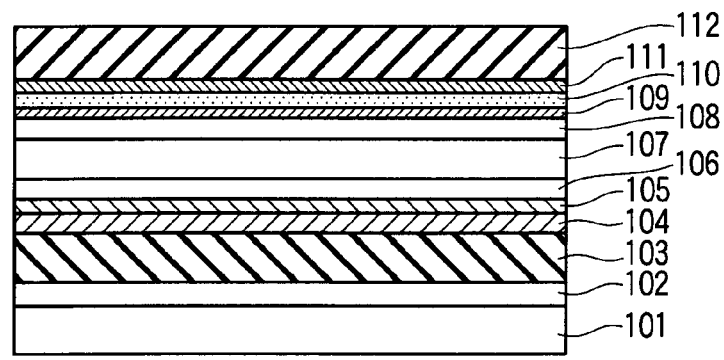
FIG. 9E is a sectional view of the storage device in a step following FIG. 9D.

As shown in FIG. 9D, a TiN film 109 having a thickness of 10 nm, a resistance-change material film 110 made of $ZnMn_2O_4$ and having a thickness of 10 nm, and a TiN film 111 having a thickness of 10 nm are sequentially formed by the sputtering method. The TiN films 109 and 111 serve as electrodes of the resistance-change material film 110, and also function as barrier metals. As shown in FIG. 9E, an insulating film 112 made of $SiO_2$ and having a thickness of 150 nm is then formed by the CVD method that uses TEOS as the main material.

Figure 9F:
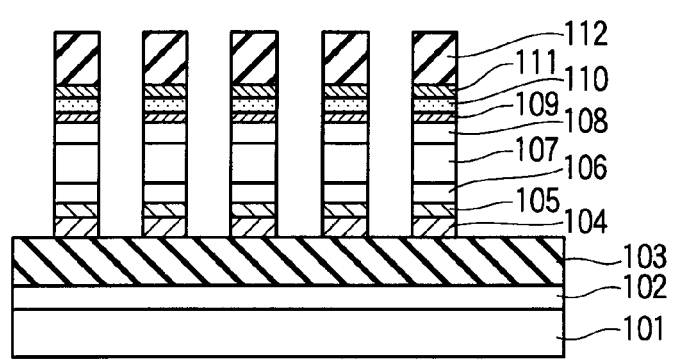
FIG. 9F is a sectional view of the storage device in a step following FIG. 9E.

As shown in FIG. 9F, a resist pattern having a pitch of 44 nm is then formed by an imprint lithography technique. The obtained resist pattern (not shown) is used as a mask to pattern the $SiO_2$ film 112 by reactive ion etching using gaseous $CHF_3$ and CO. After the resist is detached, the formed $SiO_2$ film pattern is used as an etching mask to sequentially pattern the TiN film 111, the resistance-change material film 110, the TiN film 109, the $p^+$ semiconductor region 108, the $n^-$ semiconductor region 107, the $n^+$ semiconductor region 106, and the TiN film 105 by reactive ion etching using gaseous $Cl_2$, Ar and CO. The composite film 104 of TiN and W is then patterned by reactive ion etching using gaseous $CHF_3$ and $SF_6$.

Figure 9G:
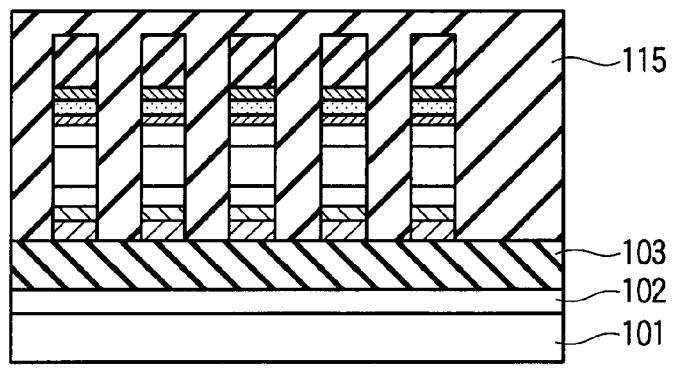
FIG. 9G is a sectional view of the storage device in a step following FIG. 9F.
Figure 9H:
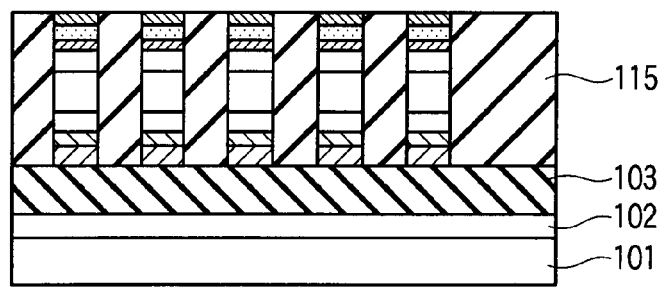
FIG. 9H is a sectional view of the storage device in a step following FIG. 9G.
Figure 9I:
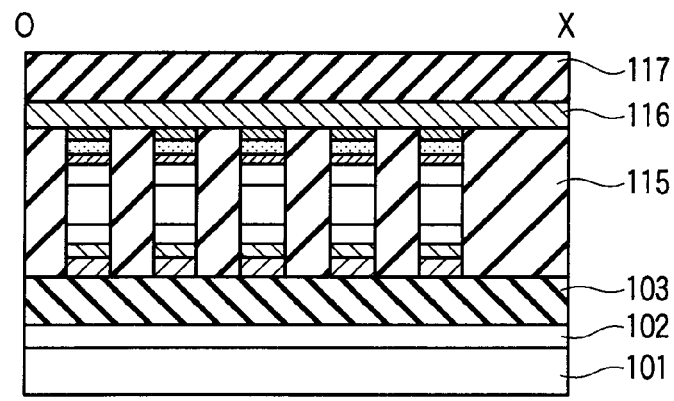
FIG. 9I is a sectional view of the storage device in a step following FIG. 9H.
Figure 9J:
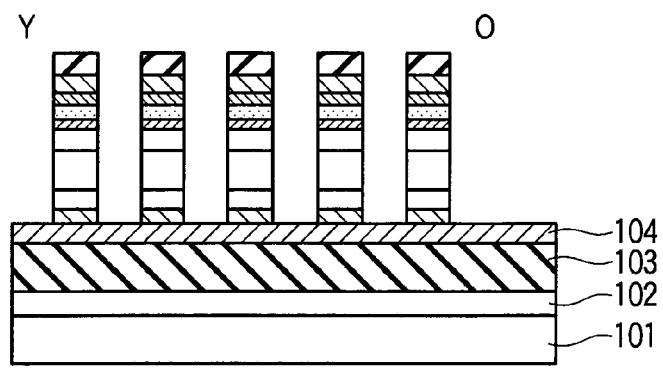
FIG. 9J is a sectional view of the storage device in a step following FIG. 9I.

Furthermore, as shown in FIG. 9G, an insulating film 115 made of $SiO_2$ is then formed by the CVD method that uses TEOS as the main material. As shown in FIG. 9H, the $SiO_2$ film 112 and insulating film 115 are planarized by a CMP method using the TiN film 111 as a stopper. As shown in FIG. 9I, a composite film 116 of TiN having a thickness of 10 nm and W having a thickness of 50 nm is then formed continuously by the sputtering method. An insulating film 117 made of $SiO_2$ is then formed by the CVD method using TEOS as the main material.

As shown in FIG. 9J (a sectional view parallel to the O-Y direction of FIG. 5) in which the section in view is rotated 90 degrees within a wafer surface, a resist pattern having a pitch of 44 nm is then formed by an imprint lithography technique. The obtained resist pattern is used as a mask to pattern the $SiO_2$ film 117 by reactive ion etching using gaseous $CHF_3$ and CO.

After the resist is detached, the formed $SiO_2$ film pattern is used as an etching mask to pattern the composite film 116 of TiN and W by reactive ion etching using gaseous $CHF_3$ and $SF_6$. Further, the TiN film 111, the resistance-change material film 110, the TiN films 109, the semiconductor region 108, the $n^-$ semiconductor region 107, the $n^+$ semiconductor region 106, and the TiN film 105 are sequentially patterned by reactive ion etching using gaseous $Cl_2$, Ar and CO, so that a memory cell portion is formed. In this process, the $n^+$ semiconductor region 106 and the TiN film 105 do not have to be completely separated from each other by etching.

Furthermore, as shown in FIG. 9K, a silicon oxide film that permits spin coating is used to fill grooves and thus form an $SiO_2$ film 118 all over the wafer surface. Although not shown, an opening is made using the lithography process and reactive ion etching, and the opening is filled with W by the CVD method in order to form a connection between the CMOS circuit 52 and the composite films 104 and 116 of TiN and W. Unnecessary parts of the top of W are removed using an etchback process.

In order to provide the memory cell portion with a multilayer structure, the process described above can be repeated to obtain a desired structure. Finally, after amorphous Si crystallization and impurity activation are collectively carried out by a thermal treatment at 800° C. for five seconds, a so-called passivation film is then formed, and a wiring connection serving as an input/output portion is formed. Further, so-called post-processes such as an inspection and dicing are carried out, and a storage device is completed.

Although arsenic is used as an n-type impurity in the diode forming process according to the present embodiment, phosphorus may be used instead. Moreover, if the implantation atom used in the ion implantation is replaced, a diode having a different stack structure can be formed.

Furthermore, although the diode is formed by a method that performs ion implantation of impurity atoms into the Si film formed by the CVD film formation without doping, the diode can also be formed by CVD film formation with doping. In this case, gaseous $AsH_3$ can be added for arsenic doping, gaseous $PH_3$ can be added for phosphorus doping, and gaseous $BCl_3$ can be added for boron doping. A desired impurity concentration distribution can be obtained by adjusting the doping amount in the film formation.

According to the present embodiment, a diode having a low reverse leakage current can be obtained to constitute a memory cell of a ReRAM, and a high-integration storage device that is easily manufactured and highly reliable is therefore provided at low cost.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope of and spirit of the inventions.

What is claimed is:

1. A storage device comprising:
   a plurality of row lines arranged parallel to one another;
   a plurality of column lines arranged parallel to one another to intersect with the row lines; and
   a memory cell which is disposed at each of intersections of the row lines and the column lines and which comprises a resistance-change element and a diode connected in series to the resistance-change element, the diode comprising a stack of a first semiconductor region containing an impurity of a first conductivity type, a second semiconductor region of a semiconductor containing an impurity of the first conductivity type lower in concentration than in the first semiconductor region, and a third semiconductor region containing an impurity of a second conductivity type,
   wherein an impurity concentration in the second semiconductor region of the diode in a first adjacent portion adjacent to the first semiconductor region is higher than that in a second adjacent portion adjacent to the third semiconductor region, and
   a thickness of the second semiconductor region in a stacking direction is less than about 100 nm and is shorter than a distance of a depletion layer defined by $(2 \in Vd/eN)^{1/2}$, at a zero bias condition, in which $\in$ is the dielectric constant of the semiconductor; Vd is built-in potential of the semiconductor; e is an elementary electric charge; and N is impurity concentration of the second semiconductor region.

2. The storage device according to claim 1, wherein the peak of the impurity concentration in the second semiconductor region is lower than the impurity concentration in the first semiconductor region.

3. The storage device according to claim 1, wherein the first adjacent portion is distant from an interface between the first semiconductor region and the second semiconductor region by 3 nm or less.

4. The storage device according to claim 1, wherein the second adjacent portion is distant from an interface between the second semiconductor region and the third semiconductor region by 3 nm or less.

5. The storage device according to claim 1, wherein the first conductivity type is an n-type, and the second conductivity type is a p-type.

6. The storage device according to claim 1, wherein the first conductivity type is a p-type, and the second conductivity type is an n-type.

7. The storage device according to claim 1, wherein a semiconductor constituting the diode includes silicon as the main element, and the impurity includes one of elements selected from the group consisting of boron, phosphorus and arsenic.

8. The storage device according to claim 1, wherein the resistance-change element includes one of substances selected from the group consisting of $ZnMn_2O_4$, $NiO$, $TiO_2$, $SrZrO_3$, and $Pr_{0.7}Ca_{0.3}MnO_3$.

9. The storage device according to claim 1, further comprising an electrode in contact with the resistance-change element, the electrode including one of substances selected from the group consisting of TiN, Pt, W, WN, TaN, and Nb-doped $TiO_2$.

* * * * *